(12) United States Patent
Shichiri

(10) Patent No.: US 12,509,612 B2
(45) Date of Patent: Dec. 30, 2025

(54) ADHESIVE COMPOSITION, ADHESIVE TAPE, AND METHOD FOR PROCESSING ELECTRONIC COMPONENT

(71) Applicant: SEKISUI CHEMICAL CO., LTD., Osaka (JP)

(72) Inventor: Tokushige Shichiri, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 201 days.

(21) Appl. No.: 17/439,576

(22) PCT Filed: Mar. 19, 2020

(86) PCT No.: PCT/JP2020/012354
§ 371 (c)(1),
(2) Date: Sep. 15, 2021

(87) PCT Pub. No.: WO2020/189764
PCT Pub. Date: Sep. 24, 2020

(65) Prior Publication Data
US 2022/0162480 A1    May 26, 2022

(30) Foreign Application Priority Data

Mar. 20, 2019  (JP) ................................. 2019-053278
Mar. 20, 2019  (JP) ................................. 2019-053279
Mar. 20, 2019  (JP) ................................. 2019-053280

(51) Int. Cl.
*C09J 7/35* (2018.01)
*C09J 179/08* (2006.01)
*H01L 21/683* (2006.01)

(52) U.S. Cl.
CPC ............ *C09J 7/35* (2018.01); *C09J 179/08* (2013.01); *H01L 21/6836* (2013.01); *C09J 2479/08* (2013.01); *H01L 2221/68381* (2013.01)

(58) Field of Classification Search
CPC ... C09J 7/35; C09J 11/08; C09J 133/24; C09J 179/08; C09J 2479/08; C09J 179/085; C09J 2203/326; C09J 2301/416; C09J 2301/502; C09J 2433/00; C09J 4/00; C09J 5/00; C08L 79/08; C08L 79/085; C08L 2666/32; C08L 2666/44; C08F 290/00; C08G 73/12; C08G 73/121; C08G 73/125; C08G 73/1014; C08G 73/1042; C08G 73/105; C08G 73/1082; H01L 21/304; H01L 21/6836; H01L 2221/68327; H01L 2221/68381
See application file for complete search history.

(56) References Cited

U.S. PATENT DOCUMENTS

| | | | |
|---|---|---|---|
| 2010/0041823 A1* | 2/2010 | Dershem | C08G 77/045 524/588 |
| 2012/0135251 A1* | 5/2012 | Jeong | H01L 24/29 524/588 |
| 2016/0208036 A1* | 7/2016 | Pugh | C07D 207/452 |

FOREIGN PATENT DOCUMENTS

| | | |
|---|---|---|
| CN | 104704072 | 6/2015 |
| JP | 5-32946 | 2/1993 |
| JP | 2013-204023 | 10/2013 |
| JP | 2014-47312 | 3/2014 |
| JP | 2015-199794 | 11/2015 |
| JP | 2016-132736 | 7/2016 |
| JP | 2017-122157 | 7/2017 |
| JP | 2019173010 A * | 10/2019 |
| TW | 201339260 | 10/2013 |
| TW | 201546231 | 12/2015 |
| TW | 201821573 | 6/2018 |
| TW | 201906896 | 2/2019 |
| WO | 2013/105582 | 7/2013 |
| WO | 2014/058056 | 4/2014 |
| WO | 2015/182469 | 12/2015 |
| WO | 2018/237377 | 12/2018 |
| WO | 2019-39340 | 2/2019 |

OTHER PUBLICATIONS

JP 2019173010 A machine translation (Oct. 2019).*
International Search Report issued May 19, 2020 in International (PCT) Patent Application No. PCT/JP2020/012354, with English translation.

* cited by examiner

*Primary Examiner* — Ana L. Woodward
(74) *Attorney, Agent, or Firm* — Wenderoth, Lind & Ponack, L.L.P.

(57) ABSTRACT

The present invention aims to provide an adhesive composition that is easily separable by irradiation with light even after high-temperature processing at 300° C. or higher with an adherend fixed thereon, an adhesive tape including an adhesive layer formed of the adhesive composition, and a method for processing an electronic component. The present invention is an adhesive composition including: a reactive resin having an imide backbone and containing a double bond-containing functional group in a side chain or at an end; and a silicone compound or a fluorine compound.

14 Claims, No Drawings

ADHESIVE COMPOSITION, ADHESIVE TAPE, AND METHOD FOR PROCESSING ELECTRONIC COMPONENT

TECHNICAL FIELD

The present invention relates to an adhesive composition, an adhesive tape, and a method for processing an electronic component.

BACKGROUND ART

During the processing of electronic components such as semiconductors, electronic components are fixed to supports using adhesive compositions or protected by adhesive tapes attached thereto for easier handling or less breakage of the electronic components. In the case where a thick wafer cut out from a highly pure silicon single crystal is ground to a thin wafer having a predetermined thickness, for example, the thick wafer is attached to a support using an adhesive composition.

Adhesive compositions and adhesive tapes thus used with electronic components are required to have high adhesiveness to firmly fixing electronic components during the processing, as well as separability from the electronic components without causing damage to the electronic components after the processing (hereafter, also referred to as "high adhesion and easy separation").

As a means for achieving high adhesion and easy separation, Patent Literature 1, for example, discloses an adhesive sheet produced using an adhesive in which to a side chain or main chain of a polymer is bonded a polyfunctional monomer or oligomer containing a radiation polymerizable functional group. The polymer is cured by irradiation with UV as it has the radiation polymerizable functional group, which allows lowering of the adhesion by irradiation with UV upon separation of the adhesive sheet, enabling separation without adhesive deposits.

CITATION LIST

Patent Literature

Patent Literature 1: JP H05-32946 A

SUMMARY OF INVENTION

Technical Problem

Recent higher-performance electronic components are subject to various types of processing. For example, in the process of forming a thin metal film on a surface of an electronic component by sputtering, the processing is performed at high temperature of around 300° C. to 350° C. to form a thin metal film having higher electroconductivity. However, high-temperature processing at 300° C. or higher performed on an electronic component protected using a conventional adhesive composition or adhesive tape may cause a rise in adhesion, leading to insufficient lowering of the adhesion or generation of adhesive deposits upon separation.

In consideration of the state of the art, the present invention aims to provide an adhesive composition that is easily separable by irradiation with light even after high-temperature processing at 300° C. or higher with an adherend fixed thereon, an adhesive tape including an adhesive layer formed of the adhesive composition, and a method for processing an electronic component.

Solution to Problem

The present invention provides an adhesive composition including: a reactive resin having an imide backbone and containing a double bond-containing functional group in a side chain or at an end; and a silicone or fluorine compound.

The present invention is specifically described in the following.

The adhesive composition that is an embodiment of the present invention includes a reactive resin having an imide backbone and containing a double bond-containing functional group in a side chain or at an end (hereafter, also simply referred to as a "reactive resin").

The reactive resin having an imide backbone has remarkably excellent heat resistance and therefore is less likely to suffer degradation of the backbone even after high-temperature processing at 300° C. or higher, thereby preventing a rise in adhesion or generation of adhesive deposits upon separation. In addition, owing to the double bond-containing functional group in a side chain or at an end of the reactive resin, the entire adhesive composition is uniformly and immediately polymerized and crosslinked by irradiation with light, which increases the modulus of elasticity to markedly lower the adhesion. Thus, the adhesive composition is easily separable.

Examples of the double bond-containing functional group present in a side chain or at an end of the reactive resin include an optionally substituted maleimide group, an optionally substituted citraconimide group, an optionally substituted vinyl ether group, an optionally substituted allyl group, and an optionally substituted (meth)acrylic group. For higher heat resistance, an optionally substituted maleimide group is favorable among these.

The reactive resin preferably has a double bond-containing functional group equivalent (weight average molecular weight/number of double bond-containing functional groups) of 4,000 or less. When the functional group equivalent is 4,000 or less, the adhesive composition can exhibit higher heat resistance. The reactive resin including the double bond-containing functional group at a density not lower than a certain level in the molecule has a shorter distance between crosslinking points to presumably further reduce a rise in adhesion caused by heating. The functional group equivalent is more preferably 3,000 or less, still more preferably 2,000 or less. The lower limit of the functional group equivalent is not limited and is practically around 600.

The reactive resin preferably has a weight average molecular weight of 5,000 or more. The reactive resin having a weight average molecular weight of 5,000 or more facilitates film formation, and the formed film exhibits flexibility to some degree. Such a film can exhibit high followability to an adherend with surface irregularities and is also easily separated from the adherend. The weight average molecular weight of the reactive resin is more preferably 10,000 or more, still more preferably 20,000 or more. The upper limit of the weight average molecular weight of the reactive resin is not limited. Yet, for securing the solubility in a solvent, the upper limit is, for example, 300,000, particularly 100,000.

The weight average molecular weight of the reactive resin is obtained as a molecular weight in terms of a polystyrene equivalent determined by gel permeation chromatography (GPC). The column used may be, for example, HR-MS-M (trade name, available from Waters Corporation).

The double bond-containing functional group may be present either in a side chain or at an end of the reactive resin. The double bond-containing functional group is preferably present at both ends of the reactive resin, more preferably present at both ends and in a side chain. The double bond-containing functional groups at both ends of the reactive resin are highly reactive to allow more sufficient curing of the adhesive composition by irradiation with light. As a result, a rise in adhesion can be further reduced, so that the adhesive composition can exhibit higher heat resistance.

Moreover, the double bond-containing functional group in a side chain of the reactive resin allows the adhesive composition to exhibit higher heat resistance. This is presumably because a shorter distance between crosslinking points further reduces a rise in adhesion caused by heating. In addition, the double bond-containing functional group in a side chain of the reactive resin facilitates adjustment of the functional group equivalent to 4,000 or less while controlling the weight average molecular weight to 5,000 or more. Thus, the adhesive composition has sufficient initial adhesion and is excellent in heat resistance. Such an adhesive composition is less likely to suffer a rise in adhesion even after high-temperature processing at 300° C. or higher and is more easily separable by irradiation with light.

Examples of the reactive resin include a reactive resin (1) including a structural unit represented by the following formula (1a), a structural unit represented by the following formula (1b), and a structural unit represented by the following formula (1c), and having ends represented by $X^1$ and $X^2$.

[Chem. 1]

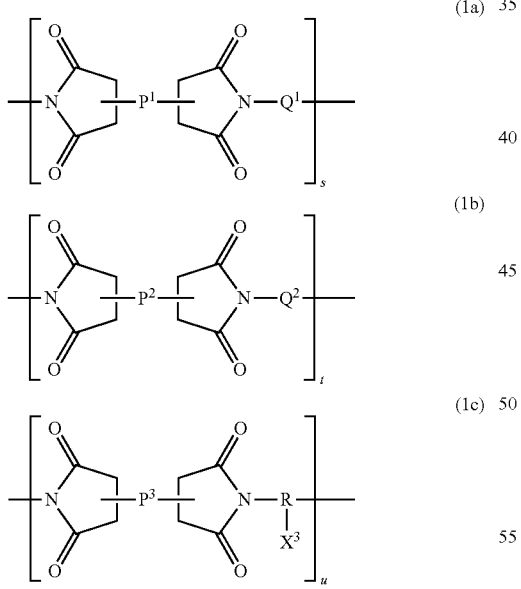

In the formulas (1a) to (1c), $s \geq 1$, $t \geq 0$, and $u \geq 0$ are satisfied; $P^1$, $P^2$, and each independently represent an aromatic group; $Q^1$ represents a substituted or unsubstituted linear, branched, or cyclic aliphatic group; $Q^2$ represents a substituted or unsubstituted aromatic structure-containing group; R represents a substituted or unsubstituted branched aliphatic or aromatic group. At least one selected from the group consisting of $X^1$, $X^2$, and $X^3$ represents a double bond-containing functional group.

In the formulas (1a) to (1c), $P^1$, $P^2$, and $P^3$ preferably each independently represent a C5-050 aromatic group. When $P^1$, $P^2$, and $P^3$ each represent a C5-050 aromatic group, the adhesive composition that is an embodiment of the present invention can exhibit particularly high heat resistance.

In the formula (1a), $Q^1$ preferably represents a substituted or unsubstituted linear, branched, or cyclic C2-C100 aliphatic group. When $Q^1$ represents a substituted or unsubstituted linear, branched, or cyclic C2-C100 aliphatic group, an adhesive tape produced using the adhesive composition that is an embodiment of the present invention can exhibit high flexibility, so that the adhesive tape can exhibit high followability to an adherend with surface irregularities and have higher separability.

$Q^1$ is preferably an aliphatic group derived from a diamine compound described later. In particular, for higher flexibility and higher compatibility between the reactive resin (1) and a solvent or another component for facilitating production of an adhesive tape, $Q^1$ preferably represents a dimer diamine-derived aliphatic group.

The dimer diamine-derived aliphatic group is not limited and is preferably at least one selected from the group consisting of a group represented by the following formula (4-1), a group represented by the following formula (4-2), a group represented by the following formula (4-3), and a group represented by the following formula (4-4). A group represented by the following formula (4-2) is more preferred among these.

[Chem. 2]

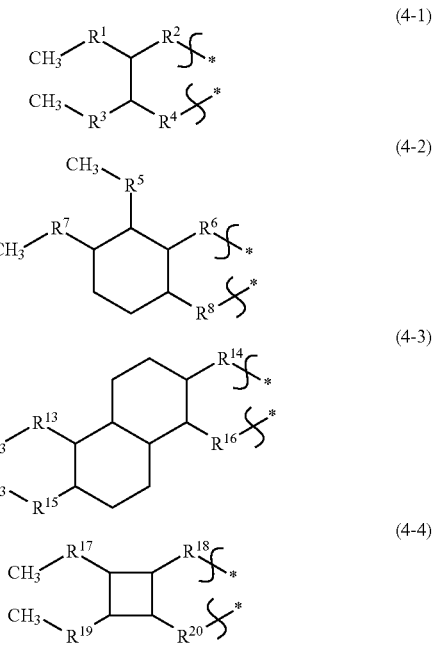

In the formulas (4-1) to (4-4), $R^1$ to $R^8$ and $R^{13}$ to $R^{20}$ each independently represent a linear or branched hydrocarbon group. In each formula, "*" represents a bond. In other words, "*" binds to N in each of the formulas (1a) to (1c).

In the formulas (4-1) to (4-4), the hydrocarbon groups represented by $R^1$ to $R^8$ and $R^{13}$ to $R^{20}$ are not limited and may be saturated hydrocarbon groups or unsaturated hydrocarbon groups. A combination of $R^1$ and $R^2$, a combination of $R^3$ and $R^4$, a combination of $R^5$ and $R^6$, a combination of $R^7$ and R % a combination of $R^{13}$ and $R^{14}$, a combination of $R^{15}$ and $R^{16}$, a combination of and $R^{18}$, and a combination of $R^{19}$ and $R^{20}$ each preferably has a total carbon number of 7 or larger and 50 or smaller. When the total carbon number is within the above range, an adhesive tape produced using the adhesive composition that is an embodiment of the present invention can exhibit higher flexibility. Moreover, the reactive resin (1) can have higher compatibility with a solvent or another component. The total carbon number is more preferably 9 or larger, still more preferably 12 or larger, even more preferably 14 or larger. The total carbon number is more preferably 35 or smaller, still more preferably 25 or smaller, even more preferably 18 or smaller.

No limitation is given on the optical isomerism of the group represented by the formula (4-1), the group represented by the formula (4-2), the group represented by the formula (4-3), and the group represented by the formula (4-4), and any optical isomers may be included.

In the formula (1b), $Q^2$ preferably represent a substituted or unsubstituted C5-050 aromatic structure-containing group. When $Q^2$ represents a substituted or unsubstituted C5-050 aromatic structure-containing group, the adhesive composition that is an embodiment of the present invention can exhibit particularly high heat resistance.

In the formula (1c), R preferably represents a substituted or unsubstituted branched C2-C100 aliphatic or aromatic group. When A represents a substituted or unsubstituted branched C2-C100 aliphatic or aromatic group, an adhesive tape produced using the adhesive composition that is an embodiment of the present invention can exhibit high flexibility to exhibit high followability to an adherend with surface irregularities and have better separability.

In the formula (1c), preferably, R represents an aromatic ester group- or aromatic ether group-containing aromatic group, and the aromatic ester group or the aromatic ether group in R binds to $X^3$.

Here, the "aromatic ester group" refers to a group in which an ester group directly binds to an aromatic ring and the "aromatic ether group" refers to a group in which an ether group directly binds to an aromatic ring. When an aromatic group thus serves as a site binding to an ester group or ether group, the adhesive composition can exhibit high heat resistance. As $X^3$ binds to R via an aromatic ester group or aromatic ether group, the double bond in $X^3$ does not conjugate with R, so that polymerization and crosslinking under irradiation with light are not disturbed.

In the reactive resin (1), the double bond-containing functional group (crosslinkable unsaturated bond) may be at least one selected from the group consisting of $X^1$, $X^2$, and $X^3$. Preferably, at least $X^3$ is a double bond-containing functional group. When at least $X^3$ is a double bond-containing functional group, the adhesive composition can exhibit higher heat resistance.

In the case where any of $X^1$, $X^2$, and $X^3$ is a functional group other than the double bond-containing functional group (functional group not containing a double bond), examples of the functional group not containing a double bond each independently include an aliphatic group, an alicyclic group, an aromatic group, an acid anhydride, and an amine compound. Specific examples include a one-end-unreacted product of an acid anhydride that is a raw material of the reactive resin (1) and a one-end-unreacted product of a diamine compound that is a raw material of the reactive resin (1).

Examples of the double bond-containing functional group in the reactive resin (1) include an optionally substituted maleimide group, an optionally substituted citraconimide group, an optionally substituted vinyl ether group, an optionally substituted allyl group, and an optionally substituted (meth)acrylic group. For higher heat resistance, preferred is an optionally substituted maleimide or allyl group among these. For particularly high adhesiveness, more preferred is a tri(iso)cyanurate group containing one or more allyl groups.

In the formulas (1a) to (1c), s is 1 or larger, preferably 3 or larger and preferably 10 or smaller, more preferably 5 or smaller. In the formulas (1a) to (1c), t is 0 or larger, preferably 1 or larger, more preferably 3 or larger and preferably 10 or smaller, more preferably 5 or smaller. In the formulas (1a) to (1c), u is 0 or larger, preferably 1 or larger, more preferably 3 or larger and preferably 10 or smaller, more preferably 5 or smaller. When s, t, and u in the formulas (1a) to (1c) are each within the above range, the adhesive composition is more easily separable by curing.

The reactive resin (1) may be a block copolymer including block components in which the structural unit represented by the formula (1a), the structural unit represented by the formula (1b), and the structural unit represented by the formula (1c) are each arranged in series or a random copolymer in which the structural units are randomly arranged.

The reactive resin can be obtained, for example, by reacting a diamine compound and an aromatic acid anhydride to prepare an imide compound and reacting a functional group in the imide compound with a compound containing a functional group reactive with the functional group and a double bond-containing functional group (hereafter, referred to as a functional group-containing unsaturated compound).

The diamine compound used may be either an aliphatic diamine compound or an aromatic diamine compound.

In the case where the diamine compound used is an aliphatic diamine compound, an adhesive tape produced using the adhesive composition that is an embodiment of the present invention can exhibit high flexibility to exhibit high followability to an adherend with surface irregularities and have better separability.

In the case where the diamine compound used is an aromatic diamine compound, the adhesive composition that is an embodiment of the present invention has higher heat resistance.

In the case where the diamine compound used is a diamine compound containing a functional group and the functional group is reacted with the functional group-containing unsaturated compound, a reactive resin containing a double bond-containing functional group in a side chain can be produced.

Each of the aliphatic diamine compound, the aromatic diamine compound, and the diamine compound containing a functional group may be used alone or in combination of two or more.

Examples of the aliphatic diamine compound include 1,10-diaminodecane, 1,12-diaminododecane, dimer diamine, 1,2-diamino-2-methylpropane, 1,2-diaminocyclohexane, 1,2-diaminopropane, 1,3-diaminopropane, 1,4-diaminobutane, 1,5-diaminopentane, 1,7-diaminoheptane, 1,8-diaminomentane, 1,8-diamincoctane, 1,9-diaminononane, 3,3'-diamino-N-methyldipropylamine, diaminomaleonitrile, 1,3-diaminopentane, bis(4-amino-3-methylcyclohexyl)methane, 1,2-bis(2-aminoethoxy)ethane, and 3(4),8(9)-bis(aminomethyl)tricyclo(5.2.1.02,6)decane.

Examples of the aromatic diamine compound include 9,10-diaminophenanthrene, 4,4'-diaminooctafluorobiphenyl, 3,7-diamino-2-methoxyfluorene, 4,4'-diaminobenzophenone, 3,4-diamincbenzophenone, 3,4-diaminotoluene, 2,6-diaminoanthraquinone, 2,6-diaminotoluene, 2,3-diaminotoluene, 1,8-diaminonaphthalene, 2,4-diaminotoluene, 2,5-diaminotoluene, 1,4-diaminoanthraquinone, 1,5-diaminoanthraquinone, 1,5-diaminonaphthalene, 1,2-diaminoanthraquinone, 2,4-cumenediamine, 1,3-bisaminomethylbenzene, 1,3-bisaminomethylcyclohexane, 2-chloro-1,4-diaminobenzene, 1,4-diamino-2,5-dichlorobenzene, 1,4-diamine-2,5-dimethylbenzene, 4,4'-diamino-2,2'-bistriflucromethylbiphenyl, bis(amino-3-chlorophenyl)ethane, bis(4-amino-3,5-dimethylphenyl)methane, bis(4-amino-3,5-diethylphenyl)methane, bis(4-amino-3-ethyldiamino)fluorene, 2,3-diaminonaphthalene, 2,3-diaminophenol, -5-methylphenyl)methane, bis(4-amino-3-methylphenyi)methane, bis(4-amino-3-ethylphenyl)methane, 4,4'-diaminophenylsulfone, 3,3'-diaminophenylsulfone, 2,2-bis(4, (4-aminophenoxy)phenyl)sulfone, 2,2-bis(4-(3-aminophencxy)phenyl)sulfone, 4,4'-oxydianiline, 4,4'-diaminodiphenylsuifide, 3,4'-oxydianiline, 2,2-bis(4-(4-aminophencxy)phenyl)propane, 1,3-bis(4-aminophenoxy)benzene, 4,4'-bis(4-aminophenoxy)biphenyl, 4,4'-diamino-3,3'-dihydroxybiphenyl, 4,4'-diamino-3,3'-dimethylbiphenyl, 4,4'-diamino-3,3'-dimethoxybiphenyl, Bisaniline M, Bisaniline P, 9,9-bis(4-aminophenyl)fluorene, o-tolidinesulfone, methylene bis(anthranilic acid), 1,3-bis(4-aminophenoxy)-2,2-dimethylpropane, 1,3-bis(4-aminophenoxy)propane, 1,4-bis(4-aminophenoxy)butane, 1,5-bis(4-aminophenoxy)butane, 2,3,5,6-tetramethyl-1,4-phenylene diamine, 3,3',5,5'-tetramethylbenzidine, 4,4'-diaminobenzanilide, 2,2-bis(4-aminophenyl)hexafluoropropane, polyoxyalkylene diamines (e.g., Jeffamine D-230, D400, D-2000, and D-4000 available from Huntsman), 1,3-cyclohexane bis(methylamine), m-xylylenediamine, and p-xylylenediamine.

Among the aliphatic diamine compounds, preferred is a dimer diamine for higher flexibility and higher compatibility between the reactive resin and a solvent or another component for facilitating production of an adhesive tape.

The dimer diamine is a diamine compound obtainable by reducing and aminating cyclic or acyclic dimer acid obtained as a dimer of an unsaturated fatty acid, and examples thereof include linear, monocyclic, and polycyclic dimer diamines. The dimer diamine may contain a carbon-carbon unsaturated double bond and may be a hydrogenated product obtained by adding hydrogen. More specifically, the dimer diamine may be a dimer diamine capable of constituting the group represented by the formula (4-1), the group represented by the formula (4-2), the group represented by the formula (4-3), and the group represented by the formula (4-4).

Examples of the diamine compound containing a functional group include diamine compounds containing hydroxy groups, diamine compounds containing carboxy groups, and diamine compounds containing halogen groups.

Examples of the diamine compounds containing hydroxy groups include 1,3-diamino-2-propanol, 2,4-diaminophenoxyethanol, 3,5-diaminophenoxyethanol, 4-diaminophenol, 3,5-diaminophenol, 2,4-diaminobenzyl alcohol, 4,6-diaminoresorsin dihydrochloride, and 2,2-bis(3-amino-4-hydroxyphenyl)hexafluoropropane. Examples of the diamine compounds containing carboxy groups include 3,5-diaminobenzoic acid. Examples of the diamine compounds containing halogen groups include 2,4-diaminochlorobenzene.

Examples of the aromatic acid anhydride include pyromellitic acid, 1,2,5,6-naphthalenetetracarboxylic acid, 2,3,6,7-naphthalenetetracarboxylic acid, 1,2,4,5-naphthalenetetracarboxylic acid, 1,4,5,8-naphthalenetetracarboxylic acid, 3,3',4,4'-benzophenonetetracarboxylic acid, 3,3',4,4'-biphenylethertetracarboxylic acid, 3,3',4,4'-biphenyltetracarboxylic acid, 2,3,5,6-pyridinetetracarboxylic acid, 3,4,9,10-perylenetetracarboxylic acid, 4,4'-sulfonyldiphthalic acid, 1-trifluoromethyl-2,3,5,6-benzenetetracarboxylic acid, 2,2',3,3'-biphenyltetracarboxylic acid, 2,2-bis(3,4-dicarboxyphenyl)propane, 2,2-bis(2,3-dicarboxyphenyl)propane, 1,1-bis(2,3-dicarboxvphenyl)ethane, 1,1-bis(3,4-dicarboxyphenyl)ethane, bis(2,3-dicarboxyphenyl)methane, bis(3,4-dicarboxyphenyi)methane, bis(3,4-dicarboxyphenyl)sulfone, bis(3,4-dicarboxyphenyl)ether, benzene-1,2,3,4-tetracarboxylic acid, 2,3,2',3'-benzophenonetetracarboxylic acid, 2,3,3',4'-benzophenonetetracarboxylic acid, phenanthrene-1,8,9,10-tetracarboxylic acid, pyrazine-2,3,5,6-tetracarboxylic acid, thiophene-2,3,4,5-tetracarboxylic acid, 2,3,3',4'-biphenyltetracarboxylic acid, 3,4,3',4'-biphenyltetracarboxylic acid, 2,3,2',3'-biphenyltetracarboxylic acid, 4,4'-bis(3,4-dicarboxyphenoxy)diphenyl sulfide, and 4,4'-(4,4'-isopropylidenediphenoxy)-bis(phthalic acid).

The functional group-containing unsaturated compound to be used is selected in accordance with the functional group at an end or in a side chain of the imide compound.

For example, in the case where the functional group at an end or in a side chain of the imide compound is a hydroxy group, a carboxy group-containing maleimide compound may be used. Examples of the carboxy group-containing maleimide compound include maleimidoacetic acid, maleimddopropionic acid, maleimidobutyric acid, maleimidohexanoic acid, trans-4-(N-maleimidomethyl)cyclohexane-1-carboxylic acid, and 19-maleimido-17-oxo-4,7,10,13-tetraoxa-16-azanonadecanoic acid. The examples also include ether group-containing vinyl compounds such as butyl vinyl ether, glycidyl group-containing allyl compounds such as diallyl monoglycidyl isocyanurate, and glycidyl group-containing allyl ether compounds such as allyl glycidyl ether, and glycerol diallylmonoglycidyl ether. The examples further include glycidyl group-containing vinyl ether compounds such as glycidyl oxyethyl vinyl ether, glycidyl oxybutyl vinyl ether, glycidyl oxyhexyl vinyl ether, glycidyl diethylene glycol vinyl ether, and glycidyl cyclohexane dimethanol monovinyl ether. The examples still further include isocyanate group-containing allyl compounds such as allyl isocyanate and isocyanate group-containing (meth)acryloyl compounds such as 2-(meth)acryloyloxy ethyl isocyanate.

In the case where the functional group at an end or in a side chain of the imide compound is a carboxy group, for example, the examples include hydroxy group-containing allyl compounds such as trimethylolpropane diallyl ether and pentaerythritol triallyl ether, and glycidyl group-containing allyl compounds such as diallyl monoglycidyl isocyanurate. The examples also include glycidyl group-containing allyl ether compounds such as allyl glycidyl ether, and glycerol diallyl monoglycidyl ether. The examples further include glycidyl group-containing vinyl ether compounds such as glycidyl oxyethyl vinyl ether, glycidyl oxybutyl vinyl ether, glycidyl oxyhexyl vinyl ether, glycidyl diethylene glycol vinyl ether, and glycidyl cyclohexane dimethanol monovinyl ether.

The adhesive composition that is an embodiment of the present invention contains a silicone or fluorine compound. As silicone and fluorine compounds have excellent heat resistance, the adhesive composition is not likely to burn even after high-temperature processing at 300° C. or higher.

Moreover, upon separation, the silicone or fluorine compound bleeds out to the interface with the adherend to facilitate separation.

The silicone compound is not limited, and examples thereof include silicone oil, silicone diacrylate, and silicone-based graft copolymers. The fluorine compound is not limited, and examples thereof include fluorine atom-containing hydrocarbon compounds.

The silicone or fluorine compound preferably contain a functional group capable of crosslinking with the reactive resin. As the silicone or fluorine compound containing a functional group capable of crosslinking with the reactive resin reacts with the reactive resin by irradiation with light to be incorporated into the reactive resin, attachment of the silicone or fluorine compound to the adherend can be avoided, thereby reducing contamination.

The functional group capable of crosslinking with the reactive resin is not limited, and examples thereof include a carboxy group, a radically polymerizable unsaturated bond (e.g., a vinyl group, a (meth)acryloyl group, an optionally substituted maleimide group), a hydroxy group, an amide group, an isocyanate group, and an epoxy group.

In particular, a silicone compound containing a functional group capable of crosslinking with the reactive resin is favorable as it is environment-friendly and easily disposable.

The silicone compound containing a functional group capable of crosslinking with the reactive resin is preferably a silicone compound having a siloxane backbone and containing a double bond-containing functional group in a side chain or at an end.

The silicone compound having a siloxane backbone and a double bond-containing functional group in a side chain or at an end is not limited but preferably contains at least one selected from the group consisting of a silicone compound represented by the following formula (I), a silicone compound represented by the following formula (II), and a silicone compound represented by the following formula (III). These silicone compounds have particularly high heat resistance and high polarity and therefore easily bleed out from the adhesive composition.

[Chem. 3]

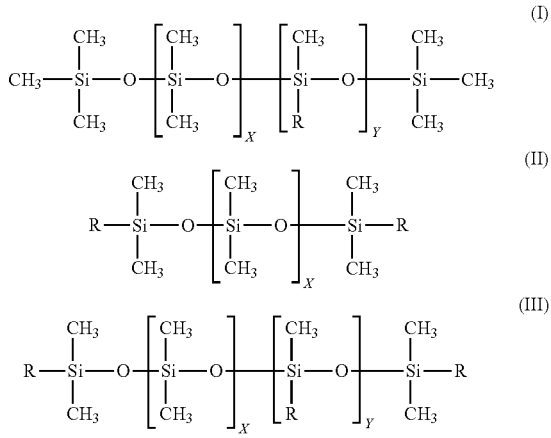

In the formulas (I), (II), and (III), X and Y each independently represent an integer of 0 to 1,200 and R represents a double bond-containing functional group.

Examples of the double bond-containing functional group for R in the formulas (I), (II), and (III) include an optionally substituted maleimide group, an optionally substituted citraconimide group, an optionally substituted vinyl ether group, an optionally substituted allyl group, and an optionally substituted (meth)acrylic group. For higher heat resistance, an optionally substituted maleimide group is favorable. In the case where multiple R's are present in the formulas (I), (II), and (III), the R's may be the same or different from each other.

Exemplary commercial products of the silicone compound containing a (meth)acrylic group in a siloxane backbone represented by the formula (I), (II), or (III) include EBECRYL350 and EBECRYL1360 (both available from Daicel-Cytec Co., Ltd.). Also included are BYK-UV3500 (available from BYK-Chemie) and TEGO RAD2250 (available from Evonik) (in these products, R represents an acrylic group).

The amount of the silicone or fluorine compound in the adhesive composition that is an embodiment of the present invention is not limited. The lower limit of the amount is preferably 0.1 parts by weight and the upper limit thereof is preferably 20 parts by weight relative to 100 parts by weight of the reactive resin. When the amount of the silicone or fluorine compound is within this range, the adhesive composition can exhibit excellent separability without contaminating the adherend. For achieving still higher separability while reducing contamination, the lower limit of the amount of the silicone or fluorine compound is more preferably 0.3 parts by weight and the upper limit thereof is more preferably 10 parts by weight.

As the adhesive composition that is an embodiment of the present invention has excellent heat resistance, a sufficient effect can be obtained even when the amount of the silicone or fluorine compound is relatively small. Accordingly, the possibility of contamination by the silicone or fluorine compound can be further lowered.

The adhesive composition that is an embodiment of the present invention preferably further contains a polyfunctional monomer or polyfunctional oligomer containing two or more double bond-containing functional groups in the molecule and having a molecular weight of 5,000 or less (hereafter, also simply referred to as a "polyfunctional monomer or polyfunctional oligomer"). The adhesive composition containing such a polyfunctional monomer or polyfunctional oligomer is more efficiently three-dimensionally reticulated by irradiation with light, thus being more easily separable.

Examples of the double bond-containing functional group in the polyfunctional monomer or polyfunctional oligomer include an optionally substituted maleimide group, an optionally substituted citraconimide group, an optionally substituted vinyl ether group, an optionally substituted allyl group, and an optionally substituted (meth)acrylic group. For higher heat resistance, an optionally substituted maleimide group is favorable among these.

The amount of the polyfunctional monomer or polyfunctional oligomer in the adhesive composition that is an embodiment of the present invention is not limited. Yet, the lower limit of the amount in 100 parts by weight of the reactive resin and the polyfunctional monomer or polyfunctional oligomer in total is preferably 5 parts by weight and the upper limit thereof is preferably 100 parts by weight. When the amount of the polyfunctional monomer or polyfunctional oligomer is within this range, the adhesive composition can exhibit particularly high separability. For still higher separability, the lower limit of the amount of the polyfunctional monomer or polyfunctional oligomer is more preferably 10 parts by weight and the upper limit thereof is more preferably 50 parts by weight.

The adhesive composition that is an embodiment of the present invention preferably further contains a photopolymerization initiator.

The photopolymerization initiator used is, for example, activated by irradiation with light at a wavelength of 250 to 800 nm.

Examples of the photopolymerization initiator include acetophenone derivative compounds such as methoxyacetopohenone, benzoin ether compounds such as benzoin propyl ether and benzoin isobutyl ether, ketal derivative compounds such as benzyl dimethyl ketal and acetophenone diethyl ketal, and phosphine oxide derivative compounds. The examples further include photoradical polymerization initiators such as bis(η5-cyclopentadienyl)titanocene derivative compounds, benzophenone, Michler's ketone, chlorothioxanthone, dodecylthioxanthone, dimethylthioxanthone, diethylthioxanthone, α-hydroxycyclohexyl phenyl ketone, and 2-hydroxymethyl phenyl propane. Each of these photopolymerization initiators may be used alone or in combination of two or more.

The amount of the photopolymerization initiator in the adhesive composition that is an embodiment of the present invention is not limited. Yet, the lower limit of the amount relative to 100 parts by weight of the reactive resin is preferably 0.1 parts by weight and the upper limit thereof is preferably 10 parts by weight. When the amount of the photopolymerization initiator is within this range, the entire adhesive composition is uniformly and immediately polymerized and crosslinked by irradiation with light to increase the modulus of elasticity, thereby markedly lowering the adhesion. Thus, the adhesive composition is easily separable. The lower limit of the amount of the photopolymerization initiator is more preferably 0.3 parts by weight and the upper limit thereof is more preferably 3 parts by weight.

The adhesive composition that is an embodiment of the present invention may further contain a gas generating agent that generates gas by irradiation with light. The adhesive composition containing the gas generating agent generates gas by irradiation with light to discharge the gas to the interface with the adherend. Thus, the adherend can be more easily separated without adhesive deposits even after high-temperature processing at 300° C. or higher.

Examples of the gas generating agent include tetrazole compounds or salts thereof, triazole compounds or salts thereof, azo compounds, azide compounds, xanthone acetic acid, and carbonates. Each of these gas generating agents may be used alone or in combination of two or more. Among these, tetrazole compounds or salts thereof are favorable for their particularly high heat resistance.

The amount of the gas generating agent in the adhesive composition that is an embodiment of the present invention is not limited. Yet, the lower limit of the amount relative to 100 parts by weight of the reactive resin is preferably 5 parts by weight and the upper limit thereof is preferably 50 parts by weight. When the amount of the gas generating agent is within this range, the adhesive composition can exhibit particularly excellent separability. The lower limit of the amount of the gas generating agent is more preferably 8 parts by weight and the upper limit thereof is more preferably 30 parts by weight.

The adhesive composition that is an embodiment of the present invention may further contain known additives such as a photosensitizer, a heat stabilizer, an antioxidant, an antistatic agent, a plasticizer, a resin, a surfactant, a wax, and a fine particle filler.

The fine particle filler may be, for example, an inorganic filler formed of at least one selected from the group consisting of oxides of silicon, titanium, aluminum, calcium, boron, magnesium, and zirconia, and composites of these. Among these, preferred are a silicon-aluminum-boron composite oxide, a silicon-titanium composite oxide, and a silica-titania composite oxide as they have similar physical properties to silica which is commonly used as an inorganic filler.

The inorganic filler may have any average particle size. The lower limit of the average particle size is preferably 0.1 µm and the upper limit thereof is preferably 30 µm.

The amount of the inorganic filler is not limited. Yet, the lower limit of the amount relative to 100 parts by weight of the reactive resin is preferably 30 parts by weight and the upper limit thereof is preferably 150 parts by weight. The lower limit of the amount of the inorganic filler is more preferably 60 parts by weight and the upper limit thereof is more preferably 120 parts by weight.

The adhesive composition that is an embodiment of the present invention may be produced by any method. For example, it can be produced by mixing the reactive resin, the silicone or fluorine compound, and optionally added additives using a device such as a bead mill, an ultrasonic disperser, a homogenizer, a high-power disperser, or a roll mill.

The present invention also encompasses an adhesive tape including an adhesive layer formed of the adhesive composition that is an embodiment of the present invention.

The adhesive tape that is an embodiment of the present invention may be a supported tape including a substrate and an adhesive layer formed of the adhesive composition that is an embodiment of the present invention on one side or both sides of the substrate, or a non-supported tape including no substrate.

Examples of the substrate include sheets formed of transparent resins such as acrylic, olefin, polycarbonate, vinyl chloride, ABS, polyethylene terephthalate (PET), polyethylene naphthalate (PEN), nylon, urethane, and polyimide. The substrate may be a sheet having a mesh-like structure or a perforated sheet.

The adhesive composition and the adhesive tape that are each an embodiment of the present invention exhibit not only initial adhesion but also excellent heat resistance, and therefore are less likely to suffer a rise in adhesion even after high-temperature processing at 300° C. or higher and easily separable by irradiation with light. The adhesive composition and the adhesive tape that are each an embodiment of the present invention are particularly excellent in heat resistance, and therefore are favorably used for protection or temporal fixing of an adherend to be subjected to high-temperature processing at 300° C. or higher. Particularly in the processing of an electronic component such as a semiconductor, the adhesive composition or the adhesive tape are favorably used to fix the electronic component on a support and the adhesive tape is favorably attached to the electronic component for protection purpose, thereby facilitating handling of the electronic component to avoid causing damage.

Specifically, for example, an electronic component is processed by a method including: temporarily fixing an electronic component on the adhesive tape that is an embodiment of the present invention; irradiating the adhesive tape with light; heat processing the electronic component; and separating the adhesive tape from the electronic component. The present invention also encompasses such a method for processing an electronic component.

The step of irradiating the adhesive tape with light may be carried out just before the step of separating the adhesive tape from the electronic component but is preferably carried out after the step of temporarily fixing an electronic component on the adhesive tape and before the step of heat processing the electronic component. The adhesive tape irradiated with light before the step of heat processing the electronic component can exhibit higher heat resistance.

Advantageous Effects of Invention

The present invention can provide an adhesive composition that is easily separable by irradiation with light even after high-temperature processing at 300° C. or higher with an adherend fixed thereon, an adhesive tape including an adhesive layer formed of the adhesive composition, and a method for processing an electronic component.

DESCRIPTION OF EMBODIMENTS

Embodiments of the present invention are more specifically described in the following with reference to, but not limited to, examples.

Preparation of Reactive Resin (1) Preparation of Reactive Resin 1

A 500-mL round flask with a Teflon (®) stirrer placed therein was charged with 250 mL of toluene. Then, 35 g (0.35 mol) of triethylamine and 35 g (0.36 mol) of methanesulfonic anhydride were added, and the mixture was stirred to form salt. After stirring for 10 minutes, 56 g (0.1 mol) of dimer diamine (Priamine 1075, available from Croda) and 19.1 g (0.09 mol) of pyromellitic anhydride were added in this order. A Dean-Stark trap and a condenser were fitted to the flask and the mixture was refluxed for two hours for formation of amine-terminated diimide. After cooling to room temperature or lower, the reaction product was blended with 12.8 g (0.13 mol) of maleic anhydride and then with 5 g (0.05 mol) of methanesulfonic anhydride. The mixture was further refluxed for 12 hours and then cooled to room temperature. To the flask was added 300 mL of toluene, and the flask was allowed to stand still for removal of precipitated impurities. The obtained solution was filtered through a glass frit funnel filled with silica gel, followed by removal of the solvent in vacuum. Thus, an amber wax-like reactive resin 1 having an imide backbone and containing a maleimide group at both ends, represented by the following formula (1-1) was obtained.

The weight average molecular weight of the obtained reactive resin 1 was 5,000, as determined by gel permeation chromatography (GPC) in which the eluent used was THF and the column used was HR-MB-M (trade name, available from Waters Corporation).

[Chem. 4]

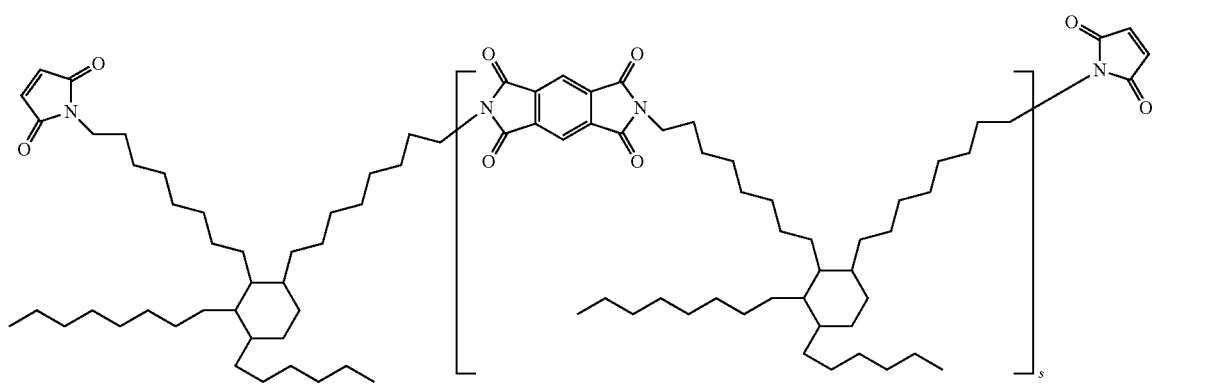

(1-1)

(2) Preparation of Reactive Resin 2

A 500-mL round flask with a Teflon (®) stirrer placed therein was charged with 250 mL of toluene. Then, 35 g (0.35 mol) of triethylamine and 35 g (0.36 mol) of methanesulfonic anhydride were added, and the mixture was stirred to form salt. After stirring for 10 minutes, 28 g (0.05 mol) of dimer diamine (Priamine 1075, available from Croda), 4.5 g (0.05 mol) of 1,3-diamino-2-propanol, and 21.8 g (0.1 mol) of pyromellitic anhydride were added in this order. A Dean-Stark trap and a condenser were fitted to the flask and the mixture was refluxed for two hours for formation of hydroxy group-containing polyimide. After cooling to room temperature, the reaction mixture was blended with 10.5 g (0.05 mol) of maleimidehexanoic acid (available from Tokyo Chemical Industry Co., Ltd.) and further refluxed for 12 hours. After cooling to room temperature, to the flask was added 300 mL of toluene, and the flask was allowed to stand still for removal of precipitated impurities. The obtained solution was filtered through a glass frit funnel filled with silica gel, followed by removal of the solvent in vacuum. Thus, an amber wax-like reactive resin 2 having an imide backbone and containing a maleimide group in a side chain, represented by the following formula (1-2) was obtained.

The weight average molecular weight of the obtained reactive resin 2 was 30,000, as determined by gel permeation chromatography (GPC) in which the eluent used was THF and the column used was HR-MB-M (trade name, available from Waters Corporation).

[Chem. 5]

(1-2)

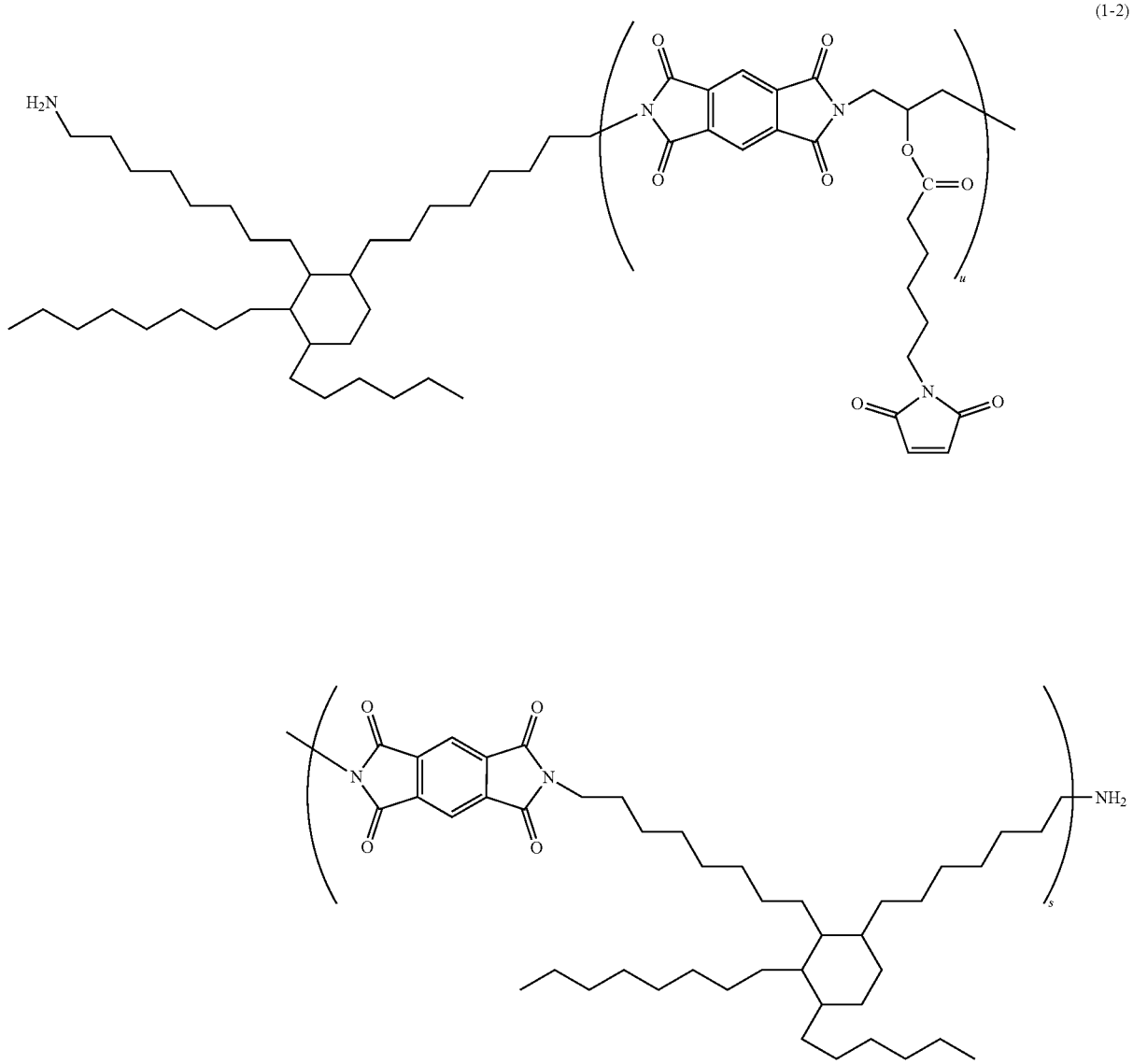

(3) Preparation of Reactive Resin 3

A 500-mL round flask with a Teflon (®) stirrer placed therein was charged with 250 mL of toluene. Then, 35 g (0.35 mol) of triethylamine and 35 g (0.36 mol) of methanesulfonic anhydride were added, and the mixture was stirred to form salt. After stirring for 10 minutes, 28 g (0.05 mol) of diner diamine (Priamine 1075, available from Croda), 4.5 g (0.05 mol) of 1,3-diamino-2-propanol, and 21.8 g (0.1 mol) of pyromellitic anhydride were added in this order. A Dean-Stark trap and a condenser were fitted to the flask and the mixture was refluxed for two hours for formation of hydroxy group-containing polyimide. After cooling of the reaction mixture to room temperature, to the flask was added 200 g of a large excess of butyl vinyl ether (available from Tokyo Chemical Industry Co., Ltd.) and 0.1 g of palladium acetate phenanthroline complex, followed by reflux at 60° C. for 14 hours. The excess butyl vinyl ether was removed using evaporator. After cooling to room temperature, to the flask was added 300 mL of toluene, and the flask was allowed to stand still for removal of precipitated impurities. The obtained solution was filtered through a glass frit funnel filled with silica gel, followed by removal of the solvent. Thus, an amber wax-like reactive resin 3 having an imide backbone and containing a vinyl ether group in a side chain, represented by the following formula (1-3) was obtained.

The weight average molecular weight of the obtained reactive resin 3 was 30,000, as determined by gel permeation chromatography (GPC) in which the eluent used was THF and the column used was HR-MB-M (trade name, available from Waters Corporation).

[Chem. 6]

(1-3)

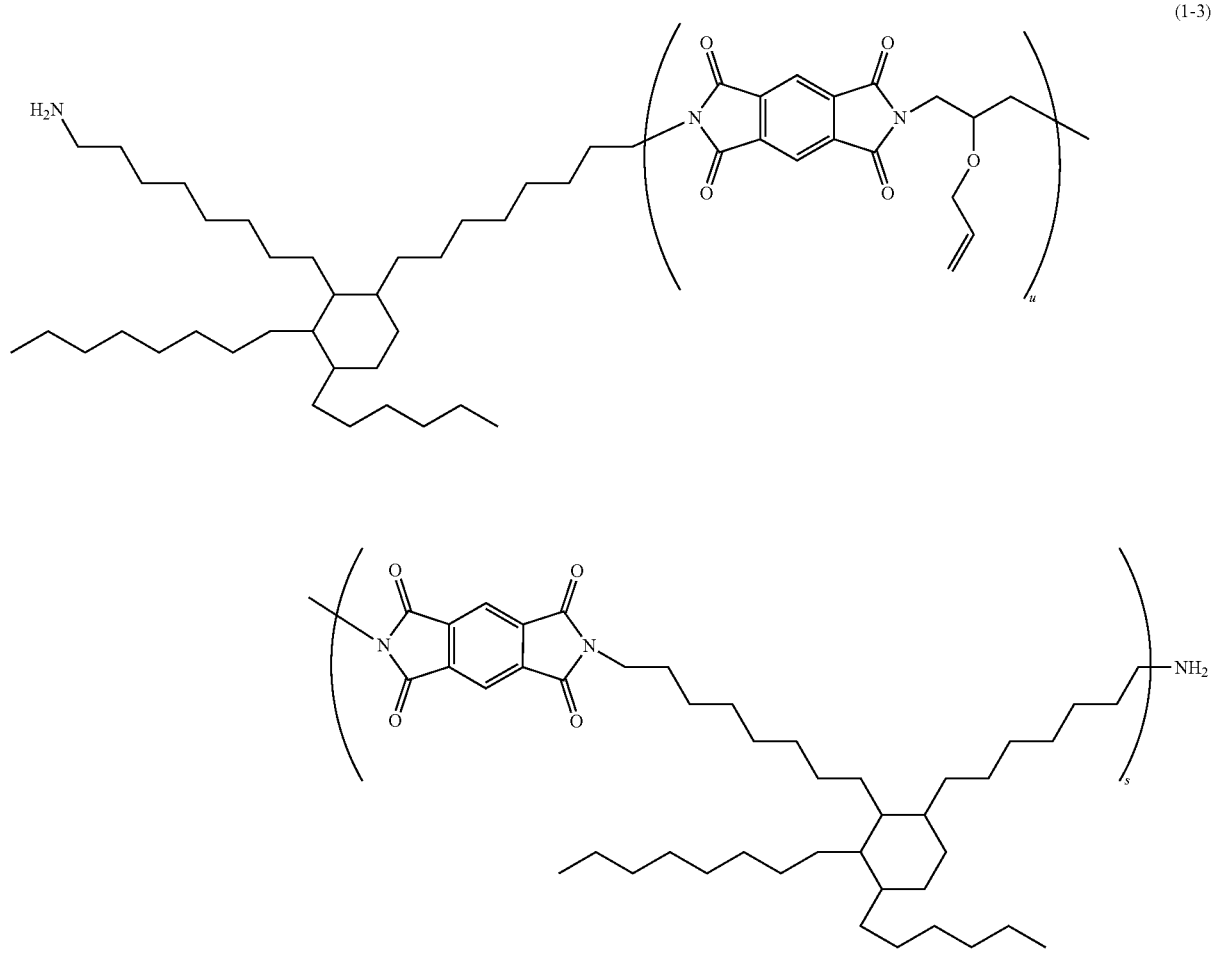

(4) Preparation of Reactive Resin 4

A 500-mL round flask with a Teflon (®) stirrer placed therein was charged with 250 mL of toluene. Then, 35 g (0.35 mol) of triethylamine and 35 g (0.36 mol) of methanesulfonic anhydride were added, and the mixture was stirred to form salt. After stirring for 10 minutes, 28 g (0.05 mol) of dimer diamine (Priamine 1075, available from Croda), 7.6 g (0.05 mol) of 3,5-diaminobenzoic acid, and 21.8 (0.1 mol) of pyromellitic anhydride were added in this order. A Dean-Stark trap and a condenser were fitted to the flask and the mixture was refluxed for two hours for synthesis of carboxylic acid-containing polyimide. After cooling of the reaction mixture to room temperature, to the flask was added 300 mL of toluene, and the flask was allowed to stand still for removal of precipitated impurities. The obtained solution was filtered through a glass frit funnel filled with silica gel, and then blended with 13.3 g (0.05 mol) of diallylmonoglycidyl isocyanurate (available from Shikoku Chemicals Corporation) and 3 g (0.3 mol) of triethylamine, followed by heating for three hours. After cooling to room temperature and removal of the solvent in vacuum, an amber wax-like reactive resin 4 having an imide backbone and containing a diallylisocyanurate group in a side chain, represented by the formula (1-4) was obtained.

The weight average molecular weight of the obtained reactive resin 4 was 35,000, as determined by gel permeation chromatography (GPO) in which the eluent used was THF and the column used was HR-MB-M (trade name, available from Waters Corporation).

[Chem. 7]

(1-4)

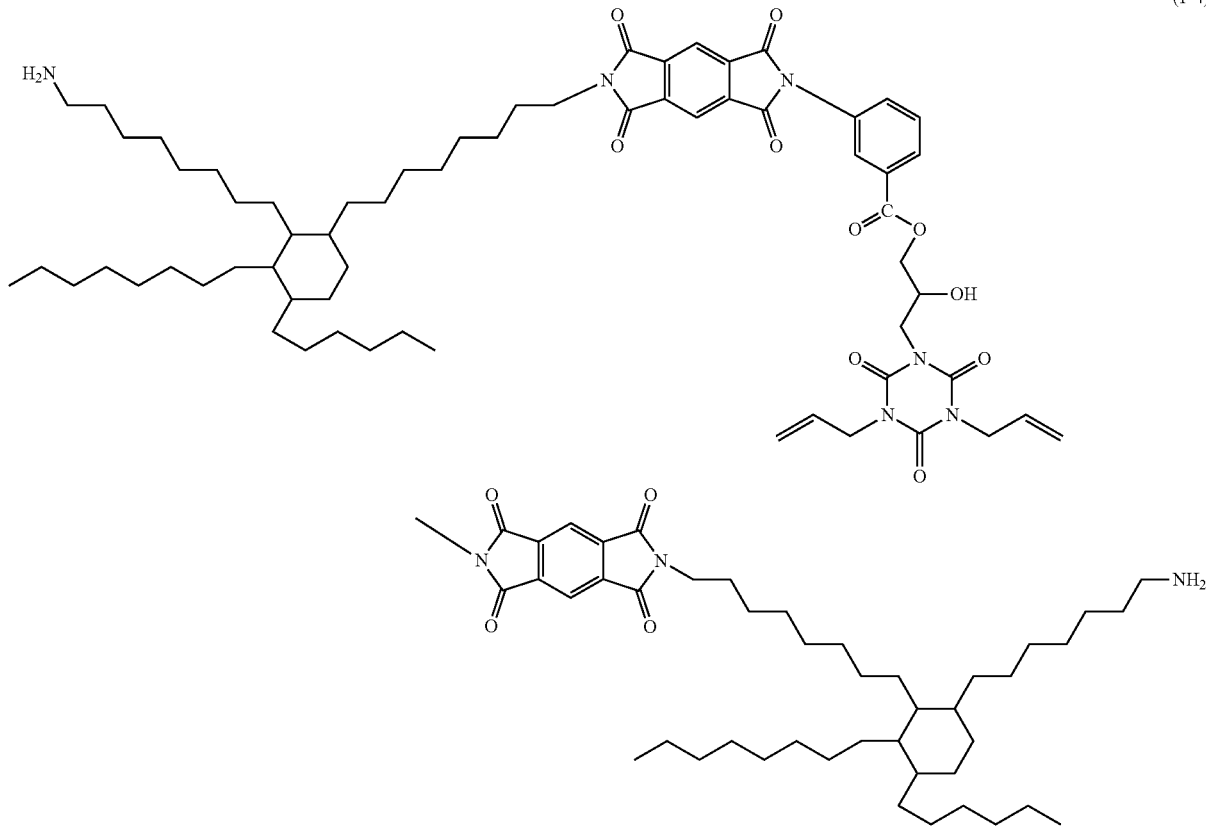

(5) Preparation of Reactive Resin 5

A 500-ml, round flask with a Teflon (®) stirrer placed therein was charged with 250 mL of toluene. Then, 35 g (0.35 mol) of triethylamine and 35 g (0.36 mol) of methanesulfonic anhydride were added, and the mixture was stirred to form salt. After stirring for 10 minutes, 47.8 g (0.09 mol) of dimer diamine (Priamine 1075, available from Croda), 3.7 g (0.01 mol) of Bis-AP-AF, and 21.8 g (0.1 mol) of pyromellitic anhydride were added in this order. A Dean-Stark trap and a condenser were fitted to the flask and the mixture was refluxed for two hours for formation of carboxylic acid-containing polyimide. After cooling of the reaction mixture to room temperature, to the flask was added 300 mL of toluene, and the flask was allowed to stand still for removal of precipitated impurities. The obtained solution was filtered through a glass frit funnel filled with silica gel, followed by addition of 4.2 g (0.02 mol) of maleimide hexanoic acid and 3 g (0.3 mol) of trimethylamine. The mixture was then heated for three hours. After cooling to room temperature and removal of the solvent in vacuum, an amber wax-like reactive resin 5 having an imide backbone and containing maleimide groups in side chains, represented by the following formula (1-5) was obtained.

The weight average molecular weight of the obtained reactive resin 5 was 35,000, as determined by gel permeation chromatography (GPC) in which the eluent used was THF and the column used was HR-MB-M (trade name, available from Waters Corporation).

[Chem. 8]

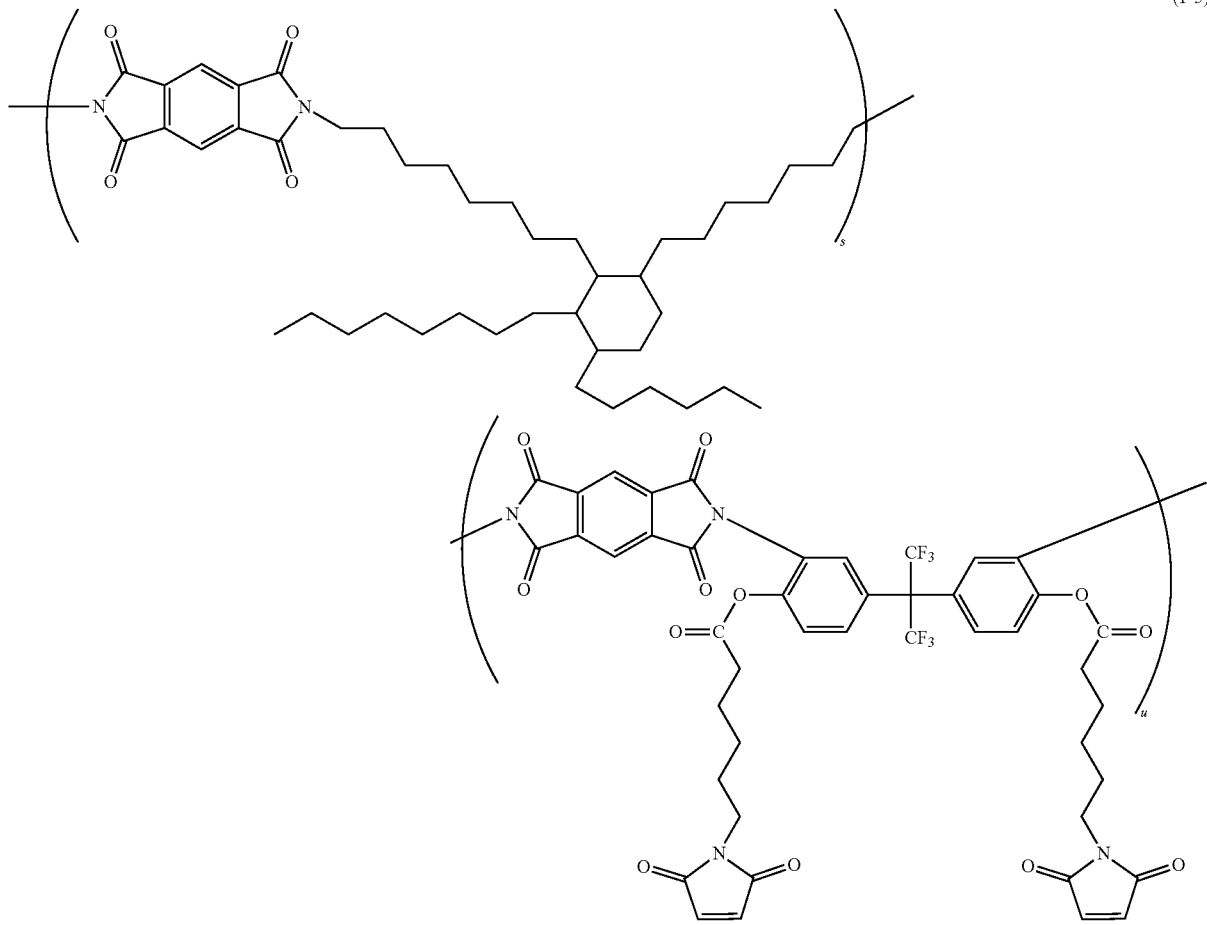

(1-5)

(6) Preparation of Reactive Resin 6

A 500-mL round flask with a Teflon (®) stirrer placed therein was charged with 250 mL of toluene. Then, 35 g (0.35 mol) of triethylamine and 35 g (0.36 mol) of methanesulfonic anhydride were added, and the mixture was stirred to form salt. After stirring for 10 minutes, 31.9 g (0.06=1) of dimer diamine (Priamine 1075, available from Croda), 14.7 g (0.04 mol) of Bis-AP-AF, and 21.8 g (0.1 mol) of pyromellitic anhydride were added in this order. A Dean-Stark trap and a condenser were fitted to the flask and the mixture was refluxed for two hours for formation of carboxylic acid-containing polyimide. After cooling of the reaction mixture to room temperature, to the flask was added 300 mL of toluene, and the flask was allowed to stand still for removal of precipitated impurities. The obtained solution was filtered through a glass frit funnel filled with silica gel, followed by addition of 16.9 g (0.08 mol) of maleimide hexanoic acid and 3 g (0.3 mol) of trimethylamine. The mixture was then heated for three hours. After cooling to room temperature and removal of the solvent in vacuum, an amber wax-like reactive resin 6 having an imide backbone and containing maleimide groups in side chains, represented by the formula (1-5) was obtained.

The weight average molecular weight of the obtained reactive resin 6 was 35,000, as determined by gel permeation chromatography (GPC) in which the eluent used was THF and the column used was HR-MB-M (trade name, available from Waters Corporation).

(7) Preparation of Reactive Resin 7

A 500-mL round flask with a Teflon (®) stirrer placed therein was charged with 250 mL of toluene. Then, 35 g (0.35 mol) of triethylamine and 35 g (0.36 mol) of methanesulfonic anhydride were added, and the mixture was stirred to form salt. After stirring for 10 minutes, 42.5 g (0.08 mol) of dimer diamine (Priamine 1075, available from Croda), 7.3 g (0.02 mol) of Bis-AP-AF, and 21.8 g (0.1 mol) of pyromellitic anhydride were added in this order. A Dean-Stark trap and a condenser were fitted to the flask and the mixture was refluxed for two hours for formation of carboxylic acid-containing polyimide. After cooling of the reaction mixture to room temperature, to the flask was added 300 mL of toluene, and the flask was allowed to stand still for removal of precipitated impurities. The obtained solution was filtered through a glass frit funnel filled with silica gel, followed by addition of 8.6 g (0.04 mol) of glycidyloxybutyl vinyl ether (GO-BVE, available from Nippon Carbide Industries Co., Inc.), and 3 g (0.3 mol) of trimethylamine. The mixture was then heated for three hours. After cooling to room temperature and removal of the solvent in vacuum, an amber wax-like reactive resin 7 having an imide backbone and containing vinyl ether groups in side chains, represented by the following formula (1-6) was obtained.

The weight average molecular weight of the obtained reactive resin 7 was 35,000, as determined by gel permeation chromatography (GPC) in which the eluent used was THF and the column used was HR-MB-M (trade name, available from Waters Corporation).

[Chem. 9]
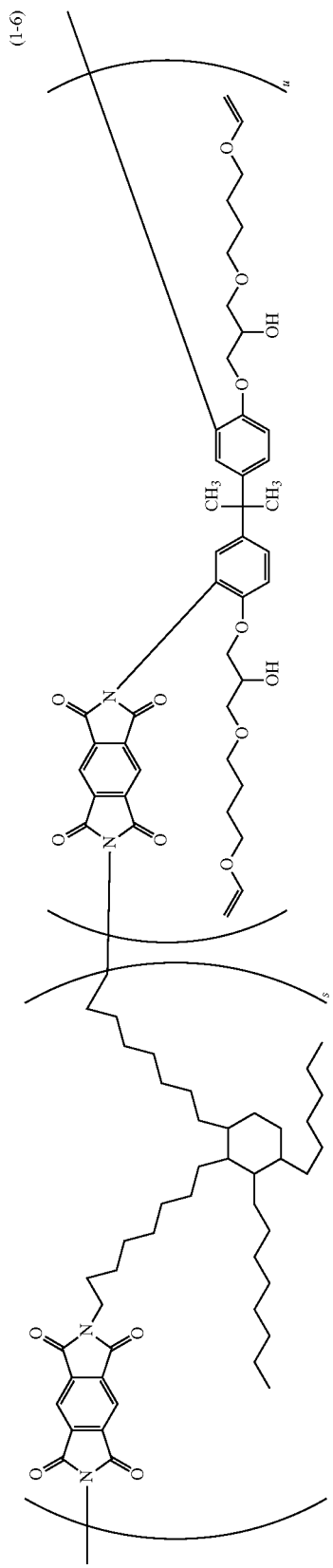
(1-6)

(8) Preparation of Reactive Resin 8

A 500-mL round flask with a Teflon (®) stirrer placed therein was charged with 250 mL of toluene. Then, 35 g (0.35 mol) of triethylamine and 35 g (0.36 mol) of methanesulfonic anhydride were added, and the mixture was stirred to form salt. After stirring for 10 minutes, 42.5 g (0.08 mol) of dimer diamine (Priamine 1075, available from Croda), 7.3 g (0.02 mol) of Bis-AP-AF, and 21.8 g (0.1 mol) of pyromellitic anhydride were added in this order. A Dean-Stark trap and a condenser were fitted to the flask and the mixture was refluxed for two hours for formation of carboxylic acid-containing polyimide. After cooling of the reaction mixture to room temperature, to the flask was added 300 mL of toluene, and the flask was allowed to stand still for removal of precipitated impurities. The obtained solution was filtered through a glass frit funnel filled with silica gel, followed by addition of 10.6 g (0.04 mol) of diaminomonoglycidyl isocyanurate (DA-MGIC, available from Shikoku Chemicals Corporation) and 3 g (0.3 mol) of trimethylamine. The mixture was then heated for three hours. After cooling to room temperature and removal of the solvent in vacuum, an amber wax-like reactive resin 8 having an imide backbone and containing allyl groups in side chains, represented by the following formula (1-7) was obtained.

The weight average molecular weight of the obtained reactive resin 8 was 35,000, as determined by gel permeation chromatography (GPO) in which the eluent used was THF and the column used was HR-MB-M (trade name, available from Waters Corporation).

[Chem. 10]
(1-7)
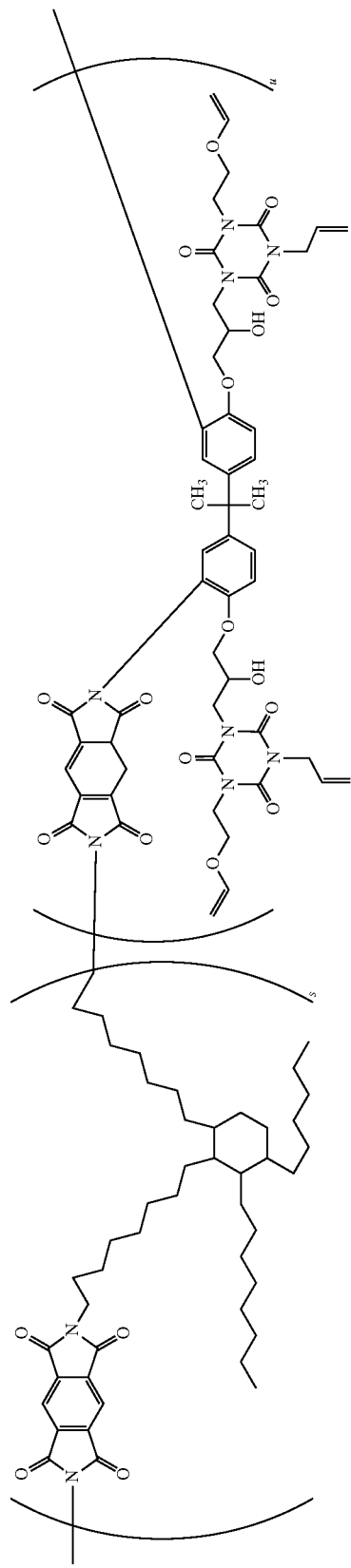

(9) Preparation of Reactive Resin 9

A 500-mL round flask with a Teflon (®) stirrer placed therein was charged with 250 mL of toluene. Then, 35 g (0.35 mol) of triethylamine and 35 g (0.36 mol) of methanesulfonic anhydride were added, and the mixture was stirred to form salt. After stirring for 10 minutes, 21.2 g (0.04 mol) of dimer diamine (Priamine 1075, available from Croda), 12.3 g (0.03 mol) of 2,2-bis[4-(4-aminophenoxy)phenyl]propane, 11.0 g (0.03 mol) of Bis-AP-AF, and 21.8 g (0.1 mol) of pyromellitic anhydride were added in this order. A Dean-Stark trap and a condenser were fitted to the flask and the mixture was refluxed for two hours for formation of carboxylic acid-containing polyimide. After cooling of the reaction mixture to room temperature, to the flask was added 300 mL of toluene, and the flask was allowed to stand still for removal of precipitated impurities. The obtained solution was filtered through a glass frit funnel filled with silica gel, followed by addition of 15.9 g (0.06 mol) of diaminomonoglycidyl isocyanurate (DA-MGIC, available from Shikoku Chemicals Corporation) and 3 g (0.3 mol) of trimethylamine. The mixture was then heated for three hours. After cooling to room temperature and removal of the solvent in vacuum, an amber solid reactive resin 9 having an imide backbone and containing allyl groups in side chains, represented by the following formula (1-8) was obtained.

The weight average molecular weight of the obtained reactive resin 9 was 35,000, as determined by gel permeation chromatography (GPC) in which the eluent used was THF and the column used was HR-MB-M (trade name, available from Waters Corporation).

[Chem. 11]
(1-8)
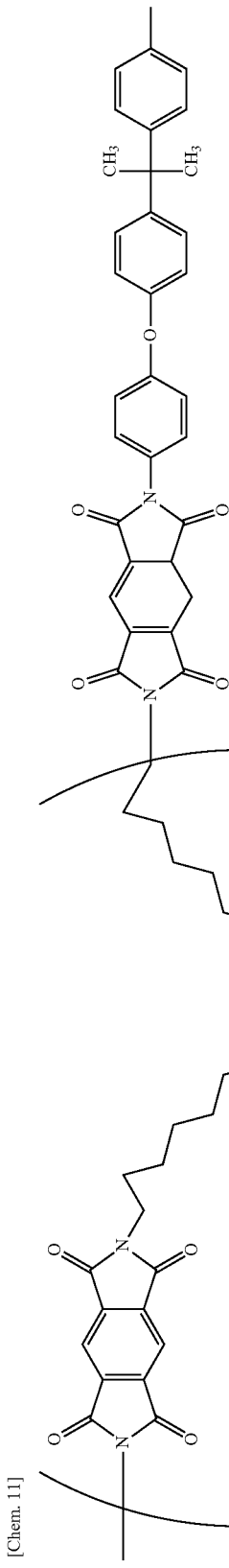
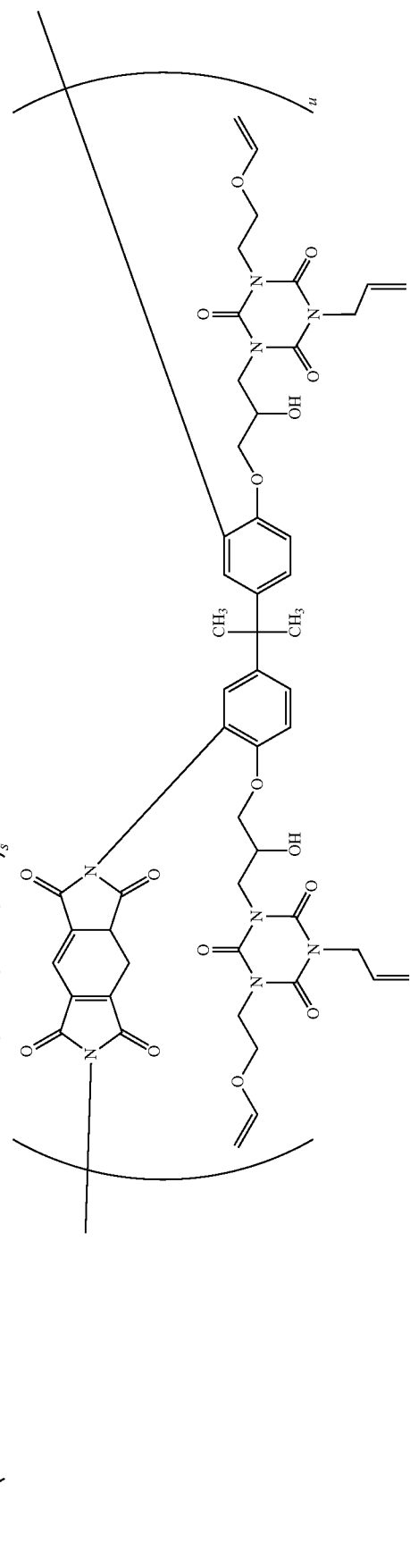

Preparation of Acrylic Reactive Resin

A reactor equipped with a thermometer, a stirrer, and a condenser was charged with 94 parts by weight of 2-ethylhexyl acrylate as a (meth)acrylic acid alkyl ester, 6 parts by weight of hydroxyethyl methacrylate as a functional group-containing monomer, 0.01 parts by weight of lauryl mercaptan, and 80 parts by weight of ethyl acetate. The reactor was heated to initiate reflux. To the reactor was subsequently added 0.01 parts by weight of 1,1-bis(t-hexylperoxy)-3,3,5-trimethylcyclohexane as a polymerization initiator to initiate polymerization under reflux. Then, 0.01 parts by weight of 1,1-bis(t-hexylperoxy)-3,3,5-trimethylcyclohexane was added one hour after and two hours after the start of the polymerization. Four hours after the start of the polymerization, 0.05 parts by weight of t-hexyl peroxypivalate was added to continue the polymerization reaction. Eight hours after the start of the polymerization, an ethyl acetate solution of a functional group-containing (meth)acrylic polymer having a solid content of 55% by weight and a weight average molecular weight of 500,000 was obtained.

To 100 parts by weight of the resin solid content of the obtained ethyl acetate solution containing a functional group-containing (meth)acrylic polymer was added 3.5 parts by weight of 2-isocyanatoethyl methacrylate as a functional group-containing unsaturated compound and reacted. Thus, an acrylic reactive resin was obtained.

The weight average molecular weight of the obtained acrylic reactive resin was 550,000, as determined by gel permeation chromatography (GPC) in which the eluent used was THF and the column used was HR-MB-M (trade name, available from Waters Corporation).

Preparation of Polyfunctional Monomer

(1) Preparation of Polyfunctional Monomer 1

A 500-mL round flask with a Teflon (®) stirrer placed therein was charged with 250 mL of toluene. To the flask was added 56 g (0.1 mol) of dimer diamine (Priamine 1075, available from Croda) and 19.6 g (0.2 mol) of maleic anhydride, followed by addition of 5 g of methanesulfonic anhydride. After reflux of the solution for 12 hours and subsequent cooling to room temperature, to the flask was added 300 mL of toluene, and the flask was allowed to stand still for removal of precipitated salt. The obtained solution was filtered through a glass frit funnel filled with silica gel, followed by removal of the solvent in vacuum. Thus, a brown liquid polyfunctional monomer 1 represented by the following formula (2-1) was obtained.

[Chem. 12]

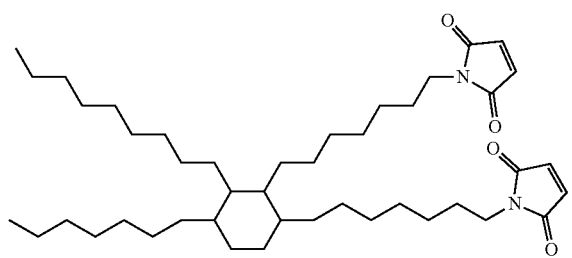

(2-1)

(2) Purchase of Polyfunctional Monomer 2

SR-387 (available from ARKEMA, tris(2-acryloxyethyl) isocyanurate), trifunctional acrylate represented by the following formula (2-2), was purchased and used as a polyfunctional monomer 2.

[Chem. 13]

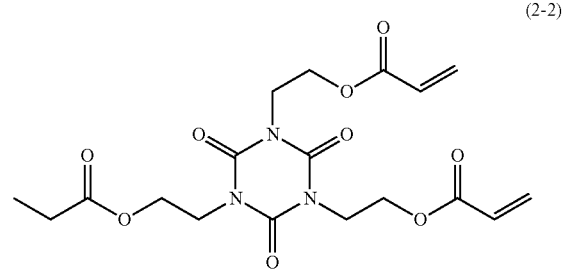

(2-2)

Preparation of Silicone Bismaleimide

A 300-mL round flask with a Teflon (®) stirrer placed therein was charged with 100 mL of toluene, followed by addition of 10.5 g (0.05 mol) of maleimide hexanoic acid (available from Tokyo Chemical Industry Co., Ltd., reagent), 25 g (0.025 mol) of X-21-5841 (available from Shin-Etsu Chemical Co., Ltd.) which is a silicone resin containing a hydroxy group at both ends, and 1 g (mol) of p-toluenesulfonic acid monohydrate. Then, the mixture was stirred under heating at 100° C. for three hours. After cooling to room temperature, 5 g of triethylamine was added thereto. After stirring for one hour, the reaction product was washed with 100 g of water, followed by vaporization of the solvent. Thus, silicone bismaleimide represented by the following formula (3) (m=11, n=5) was obtained.

[Chem. 14]

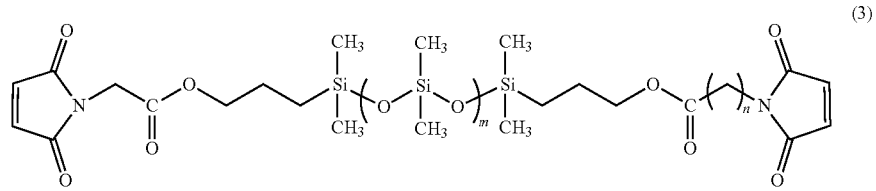

(3)

Example 1

To 150 mL of toluene were added 100 parts by weight of the reactive resin 1, 0.3 parts by weight of bifunctional silicone acrylate (EBECRYL 350, available from Daicel-Allnex Ltd.) as a silicone compound, and 1 part by weight of IRGACURE 369 (available from BASF SE) as a photopolymerization initiator. Thus, a toluene solution of an adhesive composition was prepared.

A 25-μm-thick polyimide film (Kapton, available from Ube Industries, Ltd.) one surface of which was corona-treated was prepared. The obtained toluene solution of an adhesive composition was applied to the corona-treated surface of the polyimide film to a dry thickness of 40 μm with a doctor knife, and the applied solution was dried by heating at 110° C. for one minute. The dried film was allowed to stand still at 40° C. for three days. Thus, an adhesive tape was obtained.

Examples 2 to 20, Comparative Examples 1 to 3

Adhesive compositions and adhesive tapes were obtained as in Example 1, except that the types and amounts of the reactive resin, polyfunctional monomer, silicone or fluorine compound, and photopolymerization initiator were changed as shown in Tables 1 and 2.

In Example 8, the silicone compound used was hexafunctional silicone acrylate (EBECRYL1360, available from Daicel-Allnex Ltd.).

In Example 9 and Comparative Example 1, the fluorine compound used was a photoreactive fluorine compound (MEGAFACE RS-56 available from DIC Corporation).

In Example 15, the gas generating agent used was 5-phenyl-1H tetrazole (available from Masuda Chemical Industries Co., Ltd.) and the photosensitizer used was 9,10-diglycidyl oxyanthracene (available from Kawasaki Kasei Chemicals ltd.).

(Evaluation)

The adhesive tapes obtained in the examples and comparative examples were evaluated by the following methods. Tables 1 and 2 show the results.

(1) Evaluation on Separability

The obtained adhesive tape was cut into a 1-inch-width piece, and heat laminated on a 1-mm-thick glass using a laminator at 100° C. After the lamination, the test piece was irradiated from the glass side with UV light at 365 nm at an intensity of 20 mW/cm$^2$ for 150 seconds using a ultra-high pressure mercury lamp. After the UV irradiation, the test piece was heated from the glass side on a hot plate at 300° C. for 10 minutes.

The test piece was subjected to a 180° peeling test under the conditions of 25° C. and a tensile speed of 30 mm/sec for measurement of the adhesion strength (N/inch) after the lamination, the UV irradiation, and the heating at 300° C.

(2) Evaluation on Appearance of Adhesive Tape after Heating at 300° C.

In the evaluation on separability, the appearance of the adhesive tape after the heating at 300° C. was visually observed and evaluated based on the following criteria.

∘ (Good): No separation from the glass or foaming was observed.

Δ (Fair): Fine bubbles between the tape and the glass was observed.

x (Poor): The tape was partly separated from the glass.

(3) Evaluation on Separated Surface after Heating at 300° and Separation

In the evaluation on separability, the glass surface after heating at 300° C. and separation of the adhesive tape was visually observed and evaluated based on the following criteria.

∘ (Good): No adhesive deposits were observed.

Δ (Fair): No adhesive deposits were observed but the separated surface was clouded.

x (Poor): Adhesive deposits were observed.

TABLE 1

| | | | | Example | | | | | | |
|---|---|---|---|---|---|---|---|---|---|---|
| | | | | 1 | 2 | 3 | 4 | 5 | 6 | 7 |
| Adhesive composition (parts by weight) | Reactive resin | Reactive resin 1 (maleimide groups on both ends, weight average molecular weight of 5,000) | Functional group equivalent of 2,500 | 100 | — | — | 80 | 80 | 80 | 80 |
| | | Reactive resin 2 (maleimide group in side chain, weight average molecular weight of 30,000) | Functional group equivelant of 1,200 | — | — | — | — | — | — | — |

TABLE 1-continued

| | | | | | | | | | | |
|---|---|---|---|---|---|---|---|---|---|---|
| | | Reactive resin 3 (vinyl ether group in side chain, weight average molecular weight of 30,000) | Functional group equivalent of 1,100 | — | 100 | — | — | — | — | — |
| | | Reactive resin 4 (allyl group in side chain, weight average molecular weight of 35,000) | Functional group equivalent of 1,300 | — | — | 100 | — | — | — | — |
| | | Reactive resin 5 (maleimide group in side chain, weight average molecular weight of 35,000) | Functional group equivalent of 3,800 | — | — | — | — | — | — | — |
| | | Reactive resin 6 (maleimide group in side chain, weight average molecular weight of 35,000) | Functional group equivalent of 1,700 | — | — | — | — | — | — | — |
| | | Reactive resin 7 (vinyl ether group in side chain, weight average molecular weight of 35,000) | Functional group equivalent of 2,400 | — | — | — | — | — | — | — |
| | | Reactive resin 8 (allyl group in side chain, weight average molecular weight of 35,000) | Functional group equivalent of 2,500 | — | — | — | — | — | — | — |
| | | Reactive resin 9 (allyl group in side chain, weight average molecular weight of 40,000) | Functional group equivalent of 1,850 | — | — | — | — | — | — | — |
| | | Acrylic reactive resin | — | — | — | — | — | — | — | — |
| | Polyfunctional monomer | Polyfunctional monomer 1 (Bismaleimide monomer) | | — | — | — | 20 | 20 | 20 | — |
| | | Polyfunctional monomer 2 (Trifunctional acrylate monomer) | | — | — | — | — | — | — | 20 |
| | Silicone or fluorine compound | EBECRYL350 (Silicone acrylate, bifunctional) | | 0.3 | 0.3 | 0.3 | 0.3 | 5.0 | 10 | 0.3 |
| | | EBECRYL 1 360 (Silicone acrylate, hexafunctional) | | — | — | — | — | — | — | — |
| | | MEGAFACE RS-56 (Reactive flulorine compound) | | — | — | — | — | — | — | — |
| | | Silicone bismaleimide | | — | — | — | — | — | — | — |
| | Gas generating agent | 5-Phenyl-1H tetrazole | | — | — | — | — | — | — | — |
| | Photopolymerization initiator | IRGACURE 369 | | 1 | 1 | 1 | 1 | 1 | 1 | 1 |
| | Photosensitizer | 9,10-Dibutoxyanthracene | | — | — | — | — | — | — | — |
| Evaluation | Separability | Adhesion strength after lamination (N/inch) | | 0.5 | 0.4 | 0.4 | 0.6 | 0.4 | 0.2 | 0.5 |
| | | Adhesion strength after UV irradiation (N/inch) | | 0.3 | 0.3 | 0.2 | 0.2 | 0.2 | 0.2 | 0.4 |
| | | Adhesion strength after heating at 300° C. (N/inch) | | 0.4 | 0.3 | 0.3 | 0.2 | 0.2 | 0.2 | 0.4 |
| | Appearance of adhesive tape after heating at 300° C. | | | ○ | ○ | ○ | ○ | ○ | ○ | ○ |
| | Separated surface after heating at 300° C. and separation | | | ○ | ○ | ○ | ○ | ○ | ○ | ○ |

| | | | | Example | | | | | | | |
|---|---|---|---|---|---|---|---|---|---|---|---|
| | | | | 8 | 9 | 10 | 11 | 12 | 13 | 14 | 15 |
| Adhesive composition (parts by weight) | Reactive resin | Reactive resin 1 (maleimide groups on both ends, weight average molecular weight of 5.000) | Functional group equivalent of 2,500 | 80 | 80 | 80 | — | — | — | — | 80 |
| | | Reactive resin 2 (maleimide group in side chain, weight average molecular weight of 30,000) | Functional group equivelant of 1,200 | — | — | — | 80 | 80 | — | — | — |

TABLE 1-continued

| | | | | | | | | | | | |
|---|---|---|---|---|---|---|---|---|---|---|---|
| | | Reactive resin 3 (vinyl ether group in side chain, weight average molecular weight of 30,000) | Functional group equivalent of 1,100 | — | — | — | — | — | — | 80 | — | — |
| | | Reactive resin 4 (allyl group in side chain, weight average molecular weight of 35,000) | Functional group equivalent of 1,300 | — | — | — | — | — | — | — | 80 | — |
| | | Reactive resin 5 (maleimide group in side chain, weight average molecular weight of 35,000) | Functional group equivalent of 3,800 | — | — | — | — | — | — | — | — | — |
| | | Reactive resin 6 (maleimide group in side chain, weight average molecular weight of 35,000) | Functional group equivalent of 1,700 | — | — | — | — | — | — | — | — | — |
| | | Reactive resin 7 (vinyl ether group in side chain, weight average molecular weight of 35,000) | Functional group equivalent of 2,400 | — | — | — | — | — | — | — | — | — |
| | | Reactive resin 8 (allyl group in side chain, weight average molecular weight of 35,000) | Functional group equivalent of 2,500 | — | — | — | — | — | — | — | — | — |
| | | Reactive resin 9 (allyl group in side chain, weight average molecular weight of 40,000) | Functional group equivalent of 1,850 | — | — | — | — | — | — | — | — | — |
| | | Acrylic reactive resin | — | — | — | — | — | — | — | — | — | — |
| | Polyfunctional monomer | Polyfunctional monomer 1 (Bismaleimide monomer) | | 20 | 20 | 20 | 20 | 20 | 20 | 20 | 20 | |
| | | Polyfunctional monomer 2 (Trifunctional acrylate monomer) | | — | — | — | — | — | — | — | — | |
| | Silicone or fluorine compound | EBECRYL350 (Silicone acrylate, bifunctional) | | — | — | — | 0.3 | — | 0.3 | — | 0.3 | |
| | | EBECRYL 1 360 (Silicone acrylate, hexafunctional) | | 0.3 | — | — | — | — | — | — | — | |
| | | MEGAFACE RS-56 (Reactive fluorine compound) | | — | 1 | — | — | — | — | — | — | |
| | | Silicone bismaleimide | | — | — | 0.3 | — | 0.3 | — | 0.3 | — | |
| | Gas generating agent | 5-Phenyl-1H tetrazole | | — | — | — | — | — | — | — | 10 | |
| | Photopolymerization initiator | IRGACURE 369 | | 1 | 1 | 1 | 1 | 1 | 1 | 1 | 1 | |
| | Photosensitizer | 9,10-Dibutoxyanthracene | | — | — | — | — | — | — | — | 1 | |
| Evaluation | Separability | Adhesion strength after lamination (N/inch) | | 0.3 | 0.9 | 0.3 | 0.3 | 0.3 | 0.4 | 0.3 | 0.3 | |
| | | Adhesion strength after UV irradiation (N/inch) | | 0.2 | 0.2 | 0.2 | 0.2 | 0.2 | 0.2 | 0.2 | 0.2 | |
| | | Adhesion strength after heating at 300° C. (N/inch) | | 0.2 | 0.3 | 0.2 | 0.2 | 0.1 | 0.3 | 0.1 | 0.2 | |
| | Appearance of adhesive tape after heating at 300° C. | | | ○ | ○ | ○ | ○ | ○ | ○ | ○ | ○ | |
| | Separated surface after heating at 300° C. and separation | | | ○ | ○ | ○ | ○ | ○ | ○ | ○ | ○ | |

TABLE 2

| | | | | Example | | | | | Comparative Example | | |
|---|---|---|---|---|---|---|---|---|---|---|---|
| | | | | 16 | 17 | 18 | 19 | 20 | 1 | 2 | 3 |
| Adhesive composition (parts by weight) | Reactive resin | Reactive resin 1 (maleimide groups on both ends, weight average molecular weight of 5,000) | Functional group equivalent of 2,500 | — | — | — | — | — | — | 100 | 80 |
| | | Reactive resin 2 (maleimide group in side chain, weight average molecular weight of 30,000) | Functional group equivelant of 1,200 | — | — | — | — | — | — | — | — |
| | | Reactive resin 3 (vinyl ether group in side chain, weight average molecular weight of 30,000) | Functional group equivalent of 1,100 | — | — | — | — | — | — | — | — |
| | | Reactive resin 4 (allyl group in side chain, weight average molecular weight of 35,000) | Functional group equivalent of 1,300 | — | — | — | — | — | — | — | — |
| | | Reactive resin 5 (maleimide group in side chain, weight average molecular weight of 35,000) | Functional group equivalent of 3,800 | 80 | — | — | — | — | — | — | — |
| | | Reactive resin 6 (maleimide group in side chain, weight average molecular weight of 35,000) | Functional group equivalent of 1,700 | — | 80 | — | — | — | — | — | — |
| | | Reactive resin 7 (vinyl ether group in side chain, weight average molecular weight of 35,000) | Functional group equivalent of 2,400 | — | — | 80 | — | — | — | — | — |
| | | Reactive resin 8 (allyl group in side chain, weight average molecular weight of 35,000) | Functional group equivalent of 2,500 | — | — | — | 80 | — | — | — | — |
| | | Reactive resin 9 (allyl group in side chain, weight average molecular weight of 40,000) | Functional group equivalent of 1,850 | — | — | — | — | 80 | — | — | — |
| | | Arcylic reactive resin | — | — | — | — | — | — | 100 | — | — |
| | Polyfunctional monomer | Polyfunctional monomer 1 (Bismaleimide monomer) | | 20 | 20 | 20 | 20 | 20 | — | — | 20 |
| | | Polyfunctional monomer 2 (Trifunctional acrylate monomer) | | — | — | — | — | — | — | — | — |
| | Silicone or fluorine compound | EBECRYL350 (Silicone acrylate, bifunctional) | | 0.3 | 0.3 | 0.3 | 0.3 | 0.3 | — | — | — |
| | | EBECRYL1360 (Silicone acrylate, hexafunctional) | | — | — | — | — | — | — | — | — |
| | | MEGAFACE RS-56 (Reactive fluorine compound) | | — | — | — | — | — | — | 0.5 | — |
| | | Silicone bismaleimide | | — | — | — | — | — | — | — | — |
| | Gas generating agent | 5-Phenyl-1H tetrazole | | — | — | — | — | — | — | — | — |
| | Photopolymerization initiator | IRGACURE369 | | 1 | 1 | 1 | 1 | 1 | 1 | 1 | 1 |
| | Photosensitizer | 9,10-Dibutoxyanthracene | | — | — | — | — | — | — | — | — |
| Evaluation | Separability | Adhesion strength after lamination (N/inch) | | 0.4 | 0.3 | 0.5 | 0.4 | 0.2 | 4.0 | 1.0 | 3.0 |
| | | Adhesion strength after UV irradiation (N/inch) | | 0.3 | 0.2 | 0.4 | 0.2 | 0.4 | 0.2 | 3 | 0.6 |
| | | Adhesion strength after heating at 300° C. (N/inch) | | 0.2 | 0.2 | 0.3 | 0.2 | 0.1 | 1.4 | 5 | 0.8 |
| | Appearcance of adhesive tape after heating at 300° C. | | | ◯ | ◯ | ◯ | ◯ | ◯ | x | ◯ | ◯ |
| | Separated surface after heating at 300° C. and separation | | | ◯ | ◯ | ◯ | ◯ | ◯ | x | ◯ | ◯ |

INDUSTRIAL APPLICABILITY

The present invention can provide an adhesive composition that is easily separable by irradiation with light even after high-temperature processing at 300° C. or higher with an adherend fixed thereon, an adhesive tape including an adhesive layer formed of the adhesive composition, and a method for processing an electronic component.

The invention claimed is:
1. An adhesive composition comprising:
a reactive resin having an imide backbone and containing a first double bond-containing functional group in a side chain or at an end; and
a silicone compound, wherein
an amount of the silicone compound in the adhesive composition is 0.1 parts by weight or more and 20 parts by weight or less relative to 100 parts by weight of the reactive resin,
the silicone compound is a silicone acrylate, a silicone bismaleimide, or a silicone-based graft copolymer, and contains a functional group capable of crosslinking with the reactive resin selected from the group consisting of a carboxy group, a vinyl group, a (meth)acryloyl group, an optionally substituted maleimide group, an amide group, and an isocyanate group, and the reactive resin is a reactive resin (1) comprising a structural unit represented by the following formula (1a), a structural unit represented by the following formula (1b), and a structural unit represented by the following formula (1c), and having a first end represented by $X^1$ and a second end represented by $X^2$:

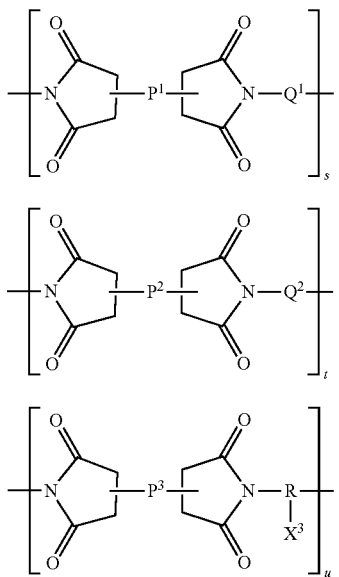

wherein $s \geq 1$, $t \geq 0$, and $u \geq 0$;

$P^1$, $P^2$, and $P^3$ each independently represent an aromatic group;

$Q^1$ represents a dimer diamine-derived aliphatic group, and the dimer diamine-derived aliphatic group is at least one selected from the group consisting of a group represented by the following formula (4-1), a group represented by the following formula (4-2), a group represented by the following formula (4-3), and a group represented by the following formula (4-4):

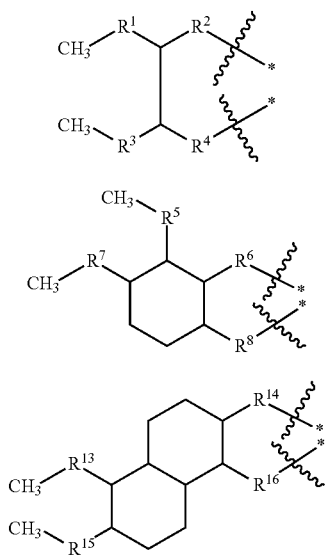

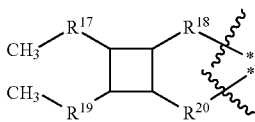

wherein $R^1$ to $R^8$ and $R^{13}$ to $R^{20}$ each independently represent a linear or branched aliphatic hydrocarbon group;

$Q^2$ represents an aromatic structure-containing group; and

R represents a branched aliphatic or aromatic group, wherein at least one selected from the group consisting of $X^1$, $X^2$, and $X^3$ represents the first double bond-containing functional group, and any of $X^1$, $X^2$, and $X^3$ which do not represent the first double bond-containing functional group is a functional group consisting of an aliphatic group, an alicyclic group, an aromatic group, an acid anhydride, or an amine compound, and wherein when t=0 and u=0, at least one selected from the group consisting of $X^1$ and $X^2$ represents the first double bond-containing functional group.

2. The adhesive composition according to claim 1, wherein the first double bond-containing functional group is a maleimide group, a citraconimide group, a vinyl ether group, an allyl group, or a (meth)acrylic group.

3. The adhesive composition according to claim 1, wherein the first double bond-containing functional group is in a side chain of the reactive resin.

4. The adhesive composition according to claim 1, wherein the reactive resin has a first double bond-containing functional group equivalent (weight average molecular weight/number of double bond-containing functional groups) of 4,000 or less.

5. The adhesive composition according to claim 1, wherein the reactive resin has a weight average molecular weight of 5,000 or more.

6. The adhesive composition according to claim 1, wherein, in the formulas (1a) to (1c), $P^1$, $P^2$, and $P^3$ each independently represent a C5-C50 aromatic group; $Q^2$ represents a C5-C50 aromatic structure-containing group; and R represents a branched C2-C100 aliphatic or aromatic group.

7. The adhesive composition according to claim 1, wherein, in the formula (1c), $X^3$ represents the first double bond-containing functional group.

8. The adhesive composition according to claim 1, wherein, in the formula (1c), R represents an aromatic ester group or aromatic ether group-containing aromatic group wherein the aromatic ester group or the aromatic ether group binds to $X^3$.

9. The adhesive composition according to claim 1, further comprising a monomer or oligomer containing two or more double bond-containing functional groups in a molecule and having a molecular weight of 5,000 or less, wherein neither the monomer nor the oligomer is the silicone compound, and the reactive resin has a molecular weight of more than 5,000.

10. The adhesive composition according claim 1, further comprising a photopolymerization initiator.

11. An adhesive tape comprising an adhesive layer comprising the adhesive composition according to claim 1.

12. A method for processing an electronic component, the method comprising;

temporarily fixing an electronic component on the adhesive tape according to claim 11, irradiating the adhesive tape with light;
heat processing the electronic component; and
separating the adhesive tape from the electronic component.

13. The adhesive composition according to claim 1, wherein when the silicone compound containing a functional group capable of crosslinking with the reactive resin is the silicone acrylate, or the silicone bismaleimide, the silicone compound has a siloxane backbone and contains a second double bond-containing functional group in a side chain or at an end, and the silicone compound having a siloxane backbone and containing a second double bond-containing functional group in a side chain or at an end contains at least one selected from the group consisting of a silicone compound represented by the following formula (I), and a silicone compound represented by the following formula (III):

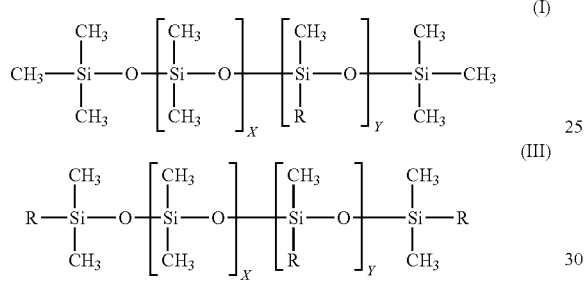

wherein X represents an integer of 0 to 1,200, Y represents an integer of 1 to 1,200, and R represents the second double bond-containing functional group.

14. An adhesive composition comprising:
a reactive resin having an imide backbone and containing a first double bond-containing functional group in a side chain or at an end; and
a silicone compound, wherein
an amount of the silicone compound in the adhesive composition is 0.1 parts by weight or more and 20 parts by weight or less relative to 100 parts by weight of the reactive resin,
the silicone compound contains a functional group capable of crosslinking with the reactive resin,
the silicone compound has a siloxane backbone and a second double bond-containing functional group in a side chain or at an end, and contains at least one selected from the group consisting of a silicone compound represented by the following formula (I), and a silicone compound represented by the following formula (III):

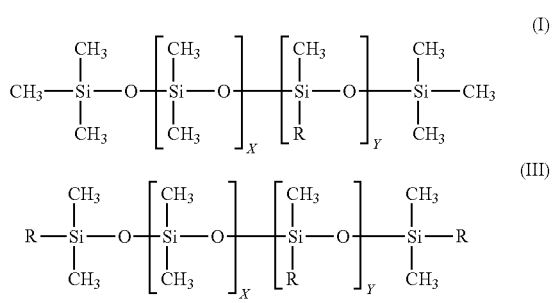

wherein X represents an integer of 0 to 1,200, Y represents an integer of 1 to 1,200, and R represents the second double bond-containing functional group.

* * * * *